United States Patent [19]

Ham et al.

[11] 3,839,111

[45] Oct. 1, 1974

[54] METHOD OF ETCHING SILICON OXIDE TO PRODUCE A TAPERED EDGE THEREON

[75] Inventors: Edward John Ham, Flemington; Ralph Robert Soden, Mendham, both of N.J.

[73] Assignee: RCA Corporation, New York, N.Y.

[22] Filed: Aug. 20, 1973

[21] Appl. No.: 389,718

[52] U.S. Cl. .................... 156/8, 96/36.2, 117/212, 117/217, 156/17, 252/79.3, 252/79.4, 357/65

[51] Int. Cl. .................... H01l 7/50

[58] Field of Search .................... 156/3, 8, 11, 13, 17; 29/576, 580, 583; 148/187; 117/211, 212, 117/213, 217; 96/36.2; 252/79.3, 79.4; 317/234, 235

[56] References Cited

UNITED STATES PATENTS

| | | | |
|---|---|---|---|
| 3,515,607 | 6/1970 | Wanesky | 96/36.2 X |
| 3,526,555 | 9/1970 | Alexander | 156/11 X |
| 3,627,598 | 12/1971 | McDonald et al. | 156/11 |
| 3,642,528 | 2/1972 | Akihiro Kimura | 117/212 |
| 3,700,508 | 10/1972 | Keen | 156/3 |
| 3,772,102 | 11/1973 | Tiemann | 96/36.2 X |

OTHER PUBLICATIONS

IBM Technical Disclosure Bulletin, Vol. 12, No. 12, May 1970, Metals as Resists For SiO2 Etching by L. H. Kaplan, Page 2087.

*Primary Examiner*—William A. Powell
*Attorney, Agent, or Firm*—Arthur I. Spechler; H. Christoffersen

[57] ABSTRACT

A method of etching away a selected portion of silicon oxide from a body of silicon oxide and tapering the edge of the remaining silicon oxide that delineates the selected portion comprises the steps of (a) delineating the selected portion with a coating of a photoresist on a surface of the body, and (b) etching away the selected portion with a composite solution that contains both an etchant for the silicon oxide and a component for lifting only the edge of the photoresist from the interface between the photoresist and the silicon oxide at the delineation of the selected portion.

8 Claims, 4 Drawing Figures

METHOD OF ETCHING SILICON OXIDE TO PRODUCE A TAPERED EDGE THEREON

Figure 1:
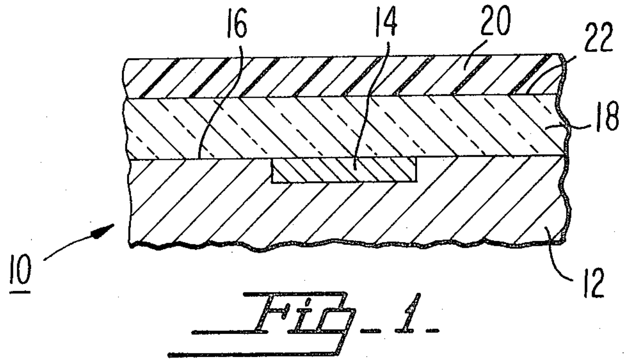

This invention relates to a method of etching silicon oxide to produce a tapered edge thereof. More particularly, the invention relates to a method of etching away a selected portion of silicon oxide from a body of silicon oxide and tapering the edge of the remaining silicon oxide delineating the selected portion. The novel method is particularly useful in the fabrication of semiconductor integrated microcircuit devices.

In the fabrication of electronic components, such as monolithic integrated circuits comprising silicon, a number of photolithographic steps are involved. The processing conditions and materials used determine the contours of the edges of photolithographically delineated structures. For some applications, very steep edges may be required, but, usually, more gradual contours are desirable. This is particularly true when a subsequently deposited thin-film metallic layer must cover a previously contour-delineated layer, or when high electric fields must be avoided.

Device defects caused by the lack of tapered contours in a photolithographically delineated structure are primarily due to discontinuities in vacuum deposited metal films as they pass over steep (90°) steps in a dielectric layer, such as silicon oxide. Partial metal discontinuities or thinning in a conductor may cause an increased series resistance in the conductor, an increased susceptibility to temperature cycling failure, and an immediate or eventual device failure upon the application of operating voltages.

A two-layer etching technique for producing a desired taper on a dielectric layer has been proposed. In this prior-art method, a faster etching layer is deposited over a slower etching layer to be tapered. The upper layer, that is, the "taper-control" layer, and the composition of the etchant are selected to produce a gradual taper, which is primarily determined by the ratio of the etch rate of the upper "taper-control" layer to that of the lower layer. While this prior-art method may be suitable for certain applications, "taper-control" layers that etch at a much higher rate than the lower layer to be tapered tend to form sharp cornered, nearly vertical, or even recessed steps. Also, reliability problems, such as microcracks, can arise in this method unless the upper "taper-control" layer is stripped before proceeding with subsequent layer depositions.

The novel method of the present invention provides means for etching a layer of silicon oxide to produce a tapered edge thereof without the necessity of employing an additional, faster etching, "taper-control" layer thereon.

Briefly, the novel method of etching away a selected portion of silicon oxide from a body of silicon oxide and tapering the edge of the remaining silicon oxide delineating the selected portion, comprises the steps of (a) delineating the selected portion with a coating of a photoresist on a surface of the body of silicon oxide, and (b) etching away the selected portion with a solution that contains both an etchant for the silicon oxide and a component for lifting the edge of the photoresist from the interface between the photoresist and the silicon oxide at the delineation of the selected portion.

The novel method will be described with the aid of the accompanying drawing in which:

FIGS. 1–4 are fragmentary views of a semiconductor device illustrating different operations of the novel method.

Referring now to FIG. 1 of the drawing, there is shown a fragmentary portion of a semiconductor device 10, such as a portion of a monolithic integrated circuit. The device 10 comprises a substrate 12, such as a body or wafer of silicon, having a doped region 14 adjacent a surface 16 of the substrate 12. If, for example, the substrate 12 is silicon of P type conductivity, the doped region 14 can be of N type conductivity.

A layer 18 of silicon oxide, essentially silicon dioxide, is deposited on the surface 16 of the substrate 12 and covers the doped region 14. The thickness of the silicon oxide layer 18 is about 10,000A, but this thickness is not critical.

In accordance with the novel method, it is desired to delineate the doped region 14, at the surface 16, with a tapered edge of the silicon oxide layer 18 so that it will be possible to make a good electrical connection between a conductor that is deposited on both the silicon oxide layer 18 and the doped region 14. To this end, a layer 20 of a photoresist is deposited on the upper surface 22 of the silicon oxide layer 18, the surface 22 being an interface between the photoresist and the silicon oxide layer 18. The photoresist layer 20 is preferably a negative photoresist, such as KTFR (Kodak thin-film resist) and is applied in a manner well known in the semiconductor processing art. The silicon oxide layer 18 should preferably be densified, as by heating it in oxygen at 1,000°C for 20 minutes, in a manner well known in the art, before the photoresist layer 20 is applied, to insure good adherence between the layers 20 and 18. This densification reduces the capacitance provided by the silicon oxide and causes the photoresist to adhere better to it.

Figure 2:
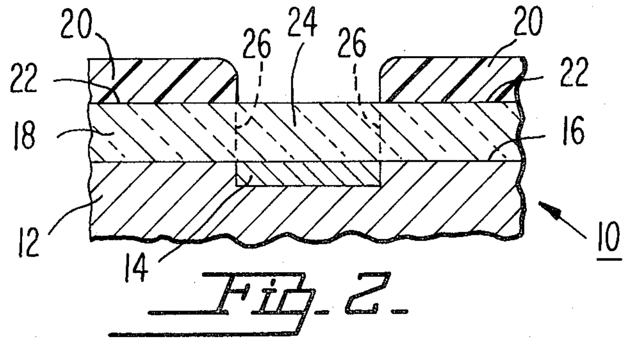

The photoresist layer 20 is next exposed and developed, in a manner well known in the art, so as to delineate the surface of a selected portion 24 of the silicon oxide layer 18, as shown in FIG. 2. In accordance with the novel method, the selected portion 24 is etched away and the doped region is delineated with a tapered edge of the silicon oxide layer 18.

The developed photoresist layer 20 is baked at a temperature of between about 95°C and 105°C for a period of between about 28 and 32 minutes prior to etching away the selected portion 24 of the silicon oxide layer 18. Also, the portion 24 should be etched within 30 minutes after the last-mentioned baking of the photoresist layer 20 to insure good (controlled) adherence of the photoresist layer 20 during the etching period. If, as in the prior art, the selected portion 24 were to be etched with only a conventional etchant for silicon oxide, such as, for example, a buffered HF solution, the doped region 14 would be delineated by steep nearly vertical edges of the silicon oxide layer 18, the steep vertical edges being illustrated diagrammatically by dashed lines 26 in FIG. 2.

In accordance with the novel method, the silicon layer 18 is etched with a composite solution that comprises both an etchant for the silicon oxide layer 18 and a resist-lifting component for lifting the edge of the photoresist layer 20 at the interface 22 between the photoresist layer 20 and the silicon oxide layer 18. The etchant for the silicon oxide layer can be a conventional buffered HF etching solution of four parts hydrofluoric acid (49 percent solution) and 6¼ parts ammonium fluoride (40 percent solution), by volume, and the resist-lifting component for lifting the edge of the photoresist layer 20, only at the interface 22, between the photoresist layer 20 and the silicon oxide layer 18 is an acid, such as nitric acid, phosphoric acid, or acetic acid, for example. The amount of the resist-lifting component in the composite solution will be dependent on the temperature chosen for the etching.

The amount of taper (angle formed with the horizontal) of the delineating edges of the silicon oxide layer 18 is determined by the concentration of the resist-lifting acid component in the composite solution, the temperature at which the etching is done, and the time duration of etching.

Suitable tapered edges of silicon oxide make an angle of between 30° and 60° with the horizontal. Specific methods of forming such tapered edges are described in the following examples:

Example 1

A silicon oxide layer, as in FIG. 1, having a thickness of about 10,000A is coated with a negative photoresist (KTFR). The photoresist is exposed and developed to delineate a selected portion of the silicon oxide layer, as in FIG. 2. The photoresist is now baked at 100° ±5°C for 30 ±2 minutes. The photoresist is cooled to at least 26°C, and the selected portion is etched within 30 minutes of the aforementioned baking. The selected portion is etched with a composite solution comprising a buffered etching solution of 25 parts, by volume, of ammonium fluoride (40 percent solution), 4 parts, by volume, hydrofluoric acid (49 percent solution), and a resist-lifting component of 15.5 parts, by volume, of glacial acetic acid at 26.5° ± 0.5°C for 10 minutes. The silicon oxide layer is next washed with deionized water, and whirled dry for 3 minutes at a speed of 2,200 ±200rpm. The taper of the silicon oxide edge produced by this example is about 40° with the horizontal.

Example 2

A silicon oxide layer 18, having a thickness of about 10,000A, is prepared as in Example 1 and etched at 40°C with a composite solution, comprising an $NH_4F$ buffered HF solution for etching the silicon oxide and a resist-lifting component comprising 5 percent sulfuric acid, by volume for 5 minutes. The percentage of sulphuric acid may vary from 3 to 7 percent, by volume, of the composite solution, and the time of etching can vary from between 3 and 7 minutes. The higher the percentage of sulphuric acid and the longer the time of etching, the greater is the degree of taper, that is, the smaller is the angle of the resulting tapered edge with the horizontal. The temperature of etching, in this and the following examples, can be lowered to about 25°C, but such lowering increases the time of etching and tapering.

Example 3

A 10,000A thick layer of silicon oxide, prepared as in Example 1, is etched with an $NH_4F$ buffered HF solution and 10 percent, by volume, of acetic acid, for 7.5 minutes, at 40°C. The percentage of acetic acid can vary from 5 to 15 percent, by volume, of the composite solution, and the etching time can vary between 5 and 10 minutes.

Example 4

A silicon oxide layer, having a thickness of about 10,000A and prepared as in Example 1, is etched with a composite solution of an $NH_4F$ buffered HF etchant and 10 percent phosphoric acid, by volume, for 4 minutes, at 40°C. The phosphoric acid may vary from between 5 and 15 percent, by volume, of the composite solution, and the time of etchant may vary from between 2.5 and 5 minutes.

Example 5

A layer of silicon oxide 18, having a thickness of about 10,000A, and prepared as in Example 1, is etched with a composite solution comprising both an $NH_4F$ buffered HF solution and 10 percent nitric acid for 5 minutes at 40°C. The percentage of nitric acid can vary from between about 5 and 15 percent, by volume, of the composite solution, and the time may vary from between about 2.5 and 7.5 minutes.

Figure 3:
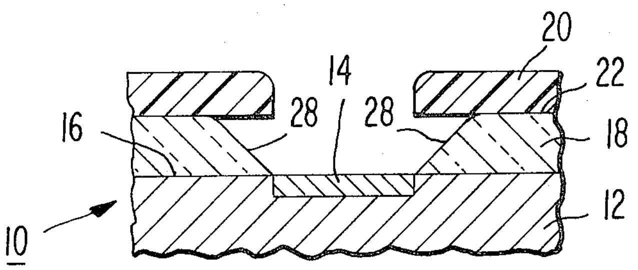

Referring now to FIG. 3, the silicon oxide layer 18 is shown with the selected portion 24 etched away, by the novel method, and delineating the doped region 14 with tapered edges 28. The photoresist layer 20 is now stripped from the silicon oxide layer 18, with the aid of a suitable stripping solution, in a manner well known in the art. An electrical connection can now be made to the doped region 14.

Figure 4:
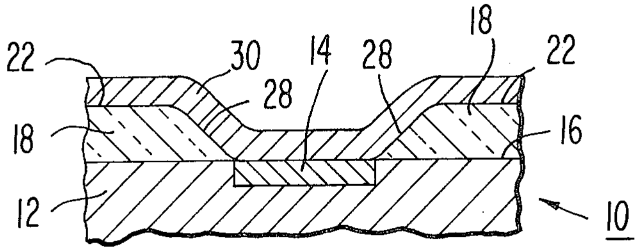

Referring now to FIG. 4, there is shown a layer 30 of a metal, such as a conductor or aluminum, for example, that can be deposited onto the surface 22 of the silicon oxide layer 18 and the surface of the doped region 14 by a vapor deposition method well known in the art. The tapered edges 28 of the silicon oxide layer 18 delineate the doped region 14 so that the vapor-deposited metal layer 30 can have a substantially uniform thickness throughout. The absence of steep (90°) steps and/or recessed portions in the edges of the etched silicon oxide eliminates the possibilities of regions of high resistivity and/or discontinuities in the deposited metal layer 30 which would otherwise occur in the absence of the tapered edges 28 of the silicon oxide layer 18.

In accordance with the novel method, it is important to get good photoresist adherence to the silicon oxide surface so that the photoresist layer is lifted only at the edge during the etching period. The function of the relatively low concentration of acid in the composite buffered etching solution is to lift only the edges of the photoresist layer at the interface between the photoresist layer and the silicon oxide layer in a controlled manner. Poor adherence and/or a total lift off of the photoresist layer is undesirable and is to be avoided in the novel method.

What is claimed is:

1. A method of etching away a selected portion of silicon oxide and tapering the edge of the remaining silicon oxide delineating the selected portion, said method comprising the steps of:

delineating said selected portion with a coating of a photoresist on a surface of said body, and etching away said selected portion with a composite solution comprising an etchant for said silicon oxide and a photoresist-lifting component to lift the edge of said photoresist where it delineates said selected portion.

2. A method as described in claim 1, wherein:

said photoresist is baked within 30 minutes prior to the step of etching away said selected portion, and said etchant for said silicon oxide comprises 25 parts, by volume, ammonium fluoride (40 percent solution) and about 4 parts, by volume, hydrofluoric acid (49 percent solution).

3. A method as described in claim 2, wherein:

said photoresist-lifting component comprises between about 3 and about 7 percent of sulphuric acid, by volume, in said composite solution, and said etching is carrried out at about 40°C.

4. A method as described in claim 2, wherein:

said photoresist-lifting component comprises between about 5 and about 15 percent acetic acid, by volume, in said composite solution, and said etching is carried out at about 40°C.

5. A method as described in claim 2, wherein:

said photoresist-lifting component comprises between about 5 and about 15 percent phosphoric acid in said composite solution, and said etching is carried out at about 40°C.

6. A method as described in claim 2, wherein:

said photoresist-lifting component is between about 5 and about 15 percent nitric acid in said composite solution, and said etching is carried out at about 40°C.

7. A method of etching away a selected portion of silicon oxide selected from a body of silicon oxide and tapering the edge of the remaining silicon oxide delineating said portion, said method comprising the steps of:

coating a surface of said body, including said selected portion, with a coating of a photoresist, exposing and developing said photoresist to delineate said selected portion, baking said photoresist to insure good adherence thereof to said silicon oxide, and applying an etching solution for said silicon oxide to said selected portion, said etching solution also containing an acid for lifting the edge of said photoresist from the interface between said photoresist and said silicon oxide, at the delineation of said selected portion, to etch away said selected portion and to provide a tapered edge of the remaining silicon oxide delineating said portion.

8. A method of etching away a selected portion of silicon oxide from a body of silicon oxide and tapering the edges of the remaining silicon oxide delineating said portion, said method comprising the steps of:

coating a surface of said body, including said selected portion, with a coating of a photoresist, exposing and developing said photoresist to delineate said selected portion, baking said photoresist at 100°C ±5°C for thirty minutes ±2 minutes, cooling said photoresist to at least 26°C, etching away said selected portion of silicon oxide with an etching solution comprising, by volume, about 25 parts ammonium fluoride (40 percent solution), about 4 parts hydrofluoric acid (49 percent solution), and about 15.5 parts of glacial acetic acid, at 26.5°C ±0.5°C, until a desired depth of etch has been obtained, washing the etched portion with deionized water, and drying said body.

* * * * *